United States Patent
Pramanick et al.

(10) Patent No.: US 7,194,668 B2
(45) Date of Patent: Mar. 20, 2007

(54) EVENT BASED TEST METHOD FOR DEBUGGING TIMING RELATED FAILURES IN INTEGRATED CIRCUITS

(75) Inventors: Ankan Pramanick, Santa Clara, CA (US); Siddharth Sawe, Santa Clara, CA (US); Rochit Rajsuman, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 560 days.

(21) Appl. No.: 10/412,078

(22) Filed: Apr. 11, 2003

(65) Prior Publication Data

US 2004/0216005 A1    Oct. 28, 2004

(51) Int. Cl.
*G01R 31/28*    (2006.01)
*G06K 5/04*    (2006.01)
(52) U.S. Cl. .................................... 714/724; 714/700
(58) Field of Classification Search ................ 714/724, 714/718, 719, 720, 700
See application file for complete search history.

(56) References Cited

U.S. PATENT DOCUMENTS

| 5,592,659 | A | 1/1997 | Toyama et al. |
| 6,331,770 | B1 * | 12/2001 | Sugamori ................ 324/158.1 |
| 6,377,065 | B1 | 4/2002 | Le et al. |
| 6,401,225 | B1 | 6/2002 | Miura |
| 6,785,858 | B2 * | 8/2004 | Niiro .......................... 714/744 |

* cited by examiner

*Primary Examiner*—James C Kerveros
(74) *Attorney, Agent, or Firm*—Muramatsu & Associates

(57) ABSTRACT

A test method for debugging failures of an IC device with use of an event based semiconductor test system is capable of distinguishing a timing related failure from other failures. The test method includes the steps of: applying a test signal to a DUT and evaluating a response output of the DUT, detecting a failure in the response output, identifying a reference clock signal related to the failure, identifying a portion of the reference clock signal that is directly related to the failure, and incrementally changing a timing of events for the identified portion of the reference clock signal to detect change in the response output from the DUT.

20 Claims, 14 Drawing Sheets

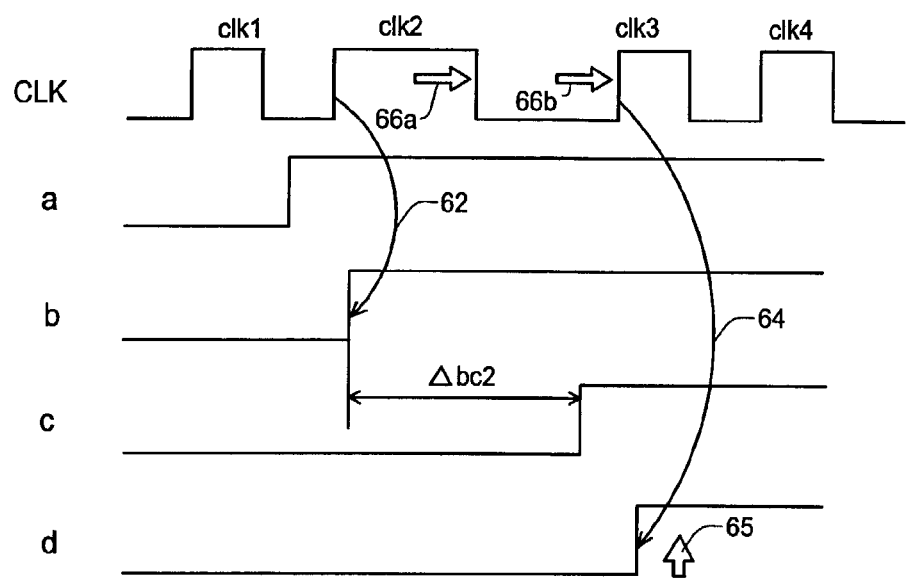

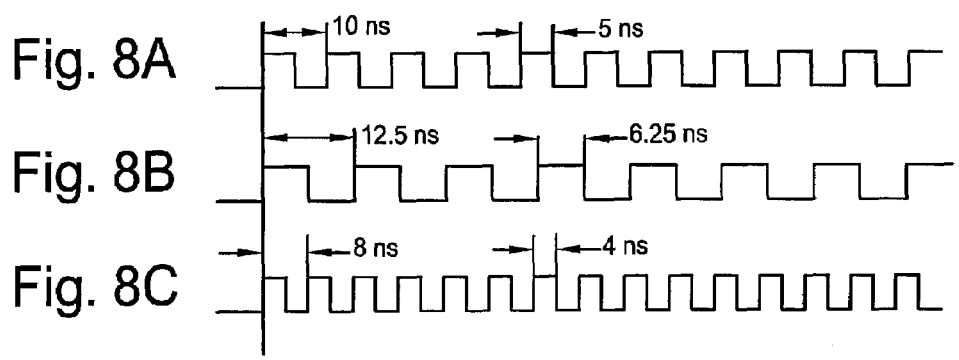
Fig. 8A
Fig. 8B
Fig. 8C
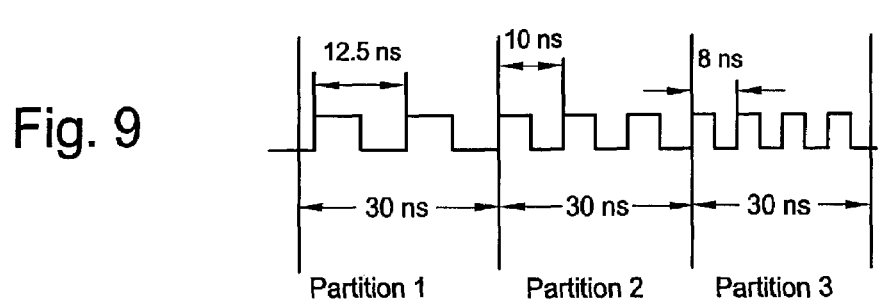
Fig. 9

Fig. 10A

| Event | Delay | Delay Count | Delay Vernier | Event Type |
|---|---|---|---|---|
| 0 | $\Delta V_0$ | C0 | V0 | Drive Logical Low |
| 1 | $\Delta V_1$ | C1 | V1 | Drive Logical High |
| 2 | $\Delta V_2$ | C2 | V2 | Drive Logical Low |
| 3 | $\Delta V_3$ | C3 | V3 | Drive Logical High |
| 4 | $\Delta V_4$ | C4 | V4 | Drive Logical Low |
| 5 | $\Delta V_5$ | C5 | V5 | Drive Logical High |
| 6 | $\Delta V_6$ | C6 | V6 | Drive Logical Low |
| 7 | $\Delta V_7$ | C7 | V7 | Drive Logical High |

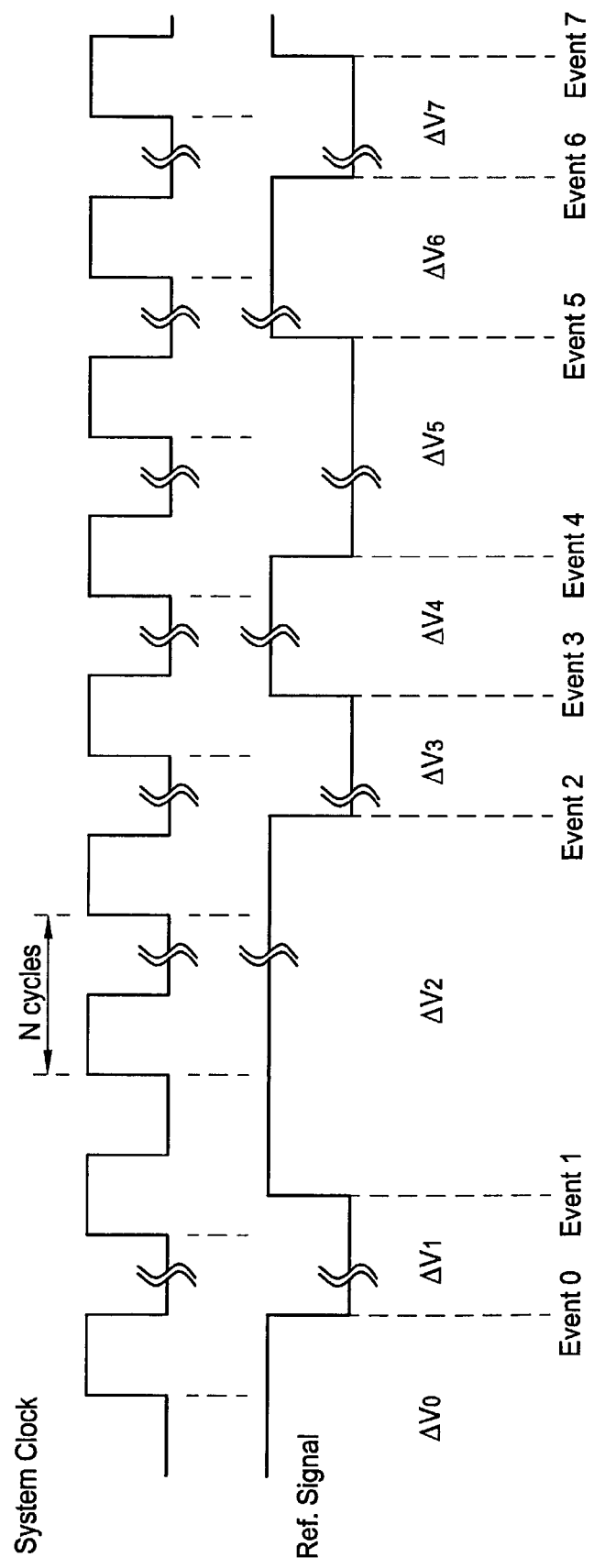

Fig. 13A

| Event | Delay | Delay Count | Delay Vernier | Event Type |
|---|---|---|---|---|
| E1 | ΔV | Cr | Vr | Drive Logical High |
| E2 | ΔV | Cr | Vr | Drive Logical Low |
| E3 | ΔV | Cr | Vr | Drive Logical High |
| E4 | ΔV | Cr | Vr | Drive Logical Low |
| E5 | ΔV | Cr | Vr | Drive Logical High |
| E6 | ΔV | Cr | Vr | Drive Logical Low |
| E7 | ΔV | Cr | Vr | Drive Logical High |
| E8 | ΔV | Cr | Vr | Drive Logical Low |
| E9 | ΔV | Cr | Vr | Drive Logical High |
| E10 | ΔV | Cr | Vr | Drive Logical Low |

Fig. 13B

| Event | Delay | Delay Count | Delay Vernier | Event Type |
|---|---|---|---|---|
| E1 | ΔV | Cr | Vr | Drive Logical High |
| E2 | ΔV | Cr | Vr | Drive Logical Low |
| E3 | ΔV | Cr | Vr | Drive Logical High |
| E4 | ΔV | Cr | Vr | Drive Logical High |
| E5 | ΔV | Cr | Vr | Drive Logical Low |
| E6 | ΔV | Cr | Vr | Drive Logical Low |
| E7 | ΔV | Cr | Vr | Drive Logical High |
| E8 | ΔV | Cr | Vr | Drive Logical Low |
| E9 | ΔV | Cr | Vr | Drive Logical High |
| E10 | ΔV | Cr | Vr | Drive Logical Low |

EVENT BASED TEST METHOD FOR DEBUGGING TIMING RELATED FAILURES IN INTEGRATED CIRCUITS

FIELD OF THE INVENTION

This invention relates to a test method to debug timing failures in integrated circuits (ICs), and more particularly, to an event based test method for timing analysis of an IC device where test signals for such analysis are defined by events and their timings instead of conventional cycle based methods using time segmented waveforms and time-sets.

BACKGROUND OF THE INVENTION

Timing related failures occur in integrated circuits (ICs) for various reasons that include variations in the manufacturing process, physical defects, thermal and environmental variations. Once an IC device shows a failure, it is desirable to determine if the failure is indeed timing related and then try to confine the timing range for that failure.

In general, a semiconductor test system provides test signals to an IC device under test (DUT), and receives output signals from the DUT generated in response to the test signals. The response outputs are sampled by strobes with specific timings to be compared with expected value data to determine whether the DUT performs correctly or not.

FIG. 1 is a schematic block diagram showing an example of conventional semiconductor test system, which is a cyclized (cycle based) test system. In the test system of FIG. 1, a pattern generator 2 receives test data from a test processor 1. The pattern generator 2 generates pattern data which is provided to a wave formatter 4 and an expected value pattern which is provided to a pattern comparator 7. A timing generator 3 provides timing data and waveform data to the wave formatter 4. The timing generator 3 also generates timing signals to synchronize the operation of the overall system.

The pattern (test vector) data defines "0" and "1", i.e., logic level of the test signal waveform. The timing data (time-sets data) defines timings (delay times) of the rising and falling edges of the waveform relative to the starting edge of the test cycle to which the waveform belongs. The waveform data specifies a waveform in a particular test cycle such as an RZ (return to zero), NRZ (non-return to zero) or EOR (exclusive OR) waveform. Based on the pattern data from the pattern generator 2, the test cycle pulses (time-sets), the timing data and waveform data from the timing generator 3, the wave formatter 4 forms a test signal having specified waveforms and timings. The wave formatter 4 sends the test signal (test pattern) to the DUT 9 through a driver 5.

A response signal from the DUT 9 is compared with a reference voltage at a predetermined strobe timing by the analog comparator 6. The resultant logic signal is provided to the pattern comparator 7 wherein a logic comparison is performed between the resultant logic pattern from the analog comparator 6 and the expected value pattern from the pattern generator 2. The pattern generator 7 checks whether two patterns match with each other, thereby determining pass or failure of the DUT 9. When a failure is detected, such failure information is provided to a failure memory 8 and is stored along with the information of the failure address of the DUT 9 from the pattern generator 2 in order to perform the failure analysis.

As noted above, in the conventional semiconductor test system such as shown in FIG. 1, a test signal to be applied to the DUT is produced in a cycle by cycle manner based on three kinds of data, i.e., pattern (vector) data, timing data and waveform data. This data structure in the conventional technology will be further described later with reference to FIG. 3 to illustrate the difference from the event based test system which implements the present invention. In the cycle based test system, because the timing of the test signal is created by selecting one or more time-sets for the corresponding test cycle, the ability and flexibility for timing analysis of an IC device under test is limited.

Namely, in debugging the timing failure of the IC device, it is desirable to freely change a selected portion of the timing of the test signal. In the semiconductor test system at the present time, however, such changes of a portion of signal is obtained by changing the timings of the signal waveform. This is done by replacing the time-sets in that particular portion of the test signal in the particular test cycle by adding or removing the time-sets to redefine the test waveform. The main difficulty is that the cycle based semiconductor test system has only a limited number of time-sets.

For example, the T6600 series IC tester of Advantest Corporation, Tokyo, Japan, has six time-sets, and some other commercially available IC testers have up to eight time-sets. While these time-sets are sufficient to define nominal signals in the present day IC devices, often, extra time-sets are not available to redefine a test signal to stretch the timing (i.e., to shift or offset the timing of a particular edge to attain an extended timing). In the case of a large circuit, multiple signals and multiple portions within each signal may require such stretching. Due to a limited number of time-sets, it is very difficult to perform timing related failure debugging in the semiconductor test system in the conventional technology.

Therefore, there is a need for developing a systematic method that can identify what portion of a signal needs to be stretched or shrunk and freely execute such timing changes. Also, such a method should not use the conventional time-sets to define waveforms because only a limited number of time-sets are available.

SUMMARY OF THE INVENTION

It is, therefore, an object of the present invention to provide a test method which is capable of shifting the timing of a particular portion of the test signal by stretching or shrinking the portion for specifying a timing related failure of an IC device under test.

It is another object of the present invention to provide a test method which is capable of stretching or shrinking the timing of a portion of test signal or an entire test signal by changing event data that is processed by an event based test system.

It is another object of the present invention to provide a test method which is capable of stretching or shrinking the timing of an entire test signal by changing a rate of event clock for all of the events in the test signal.

It is a further object of the present invention to provide a test method which is capable of changing the clock rate by dynamically changing the scale factor for each time slot of the length of test pattern.

The test method of the present invention determines if a failure is indeed a timing related failure by performing the stretch or shrink operations. The method includes the steps of: applying a test signal to a DUT and evaluating a response output of the DUT, detecting a failure in the response output, identifying a reference signal related to the failure, identifying a portion of the reference signal, and incrementally changing a timing of the portion of the reference signal to detect a pass result in the response output from the DUT.

The primary advantage of the present invention is that it is event based and hence it overcomes the drawback of limited time-sets and wave-groups of the cycle based test system in the conventional technology. This method is systematic and it can easily be automated. Because the present invention is based upon changing timing of events, one or more events can be shifted in time axis. By changing one or more events, a small portion of signal can be stretched or shrunk, while by changing all events in the signal, the whole signal can be stretched or shrunk.

BRIEF DESCRIPTION OF THE DRAWINGS

FIGS. 5A–5C are timing charts showing three different types of timing related behaviors of an IC device under test in the test configuration of FIG. 4B.

FIGS. 8A–8C are timing charts showing a concept of event scaling where a repetition rate of event clock is changed in proportion to a scale factor.

FIG. 9 is a timing chart showing a concept of event scaling where a repetition rate of event clock is dynamically changed at each time slot within a single test.

FIG. 10A is a diagram showing an example of event data stored in an event memory in the event based test system, and FIG. 10B is a timing chart showing waveforms consisting of a series of events produced by the event data of FIG. 10A.

FIG. 13A shows an example of event data for generating the clock CLK of FIG. 12, and FIG. 13B shows an example of event data for generating the clock CLK' of FIG. 12 where the timings of particular edges are stretched.

DETAILED DESCRIPTION OF THE INVENTION

The test method of the present invention for debugging timing related failures is described with reference to the accompanying drawings. The test method of the present invention is implemented by an event based test system rather than the conventional cycle based test system. The concept of the event based test system has been introduced in U.S. Pat. Nos. 6,360,343 and 6,532,561 owned by the same assignee of the present invention, both of which are incorporated by reference. Before explaining the details of the test method of the present invention, an event based test system will be briefly described with reference to FIGS. 2 and 3.

Figure 1:
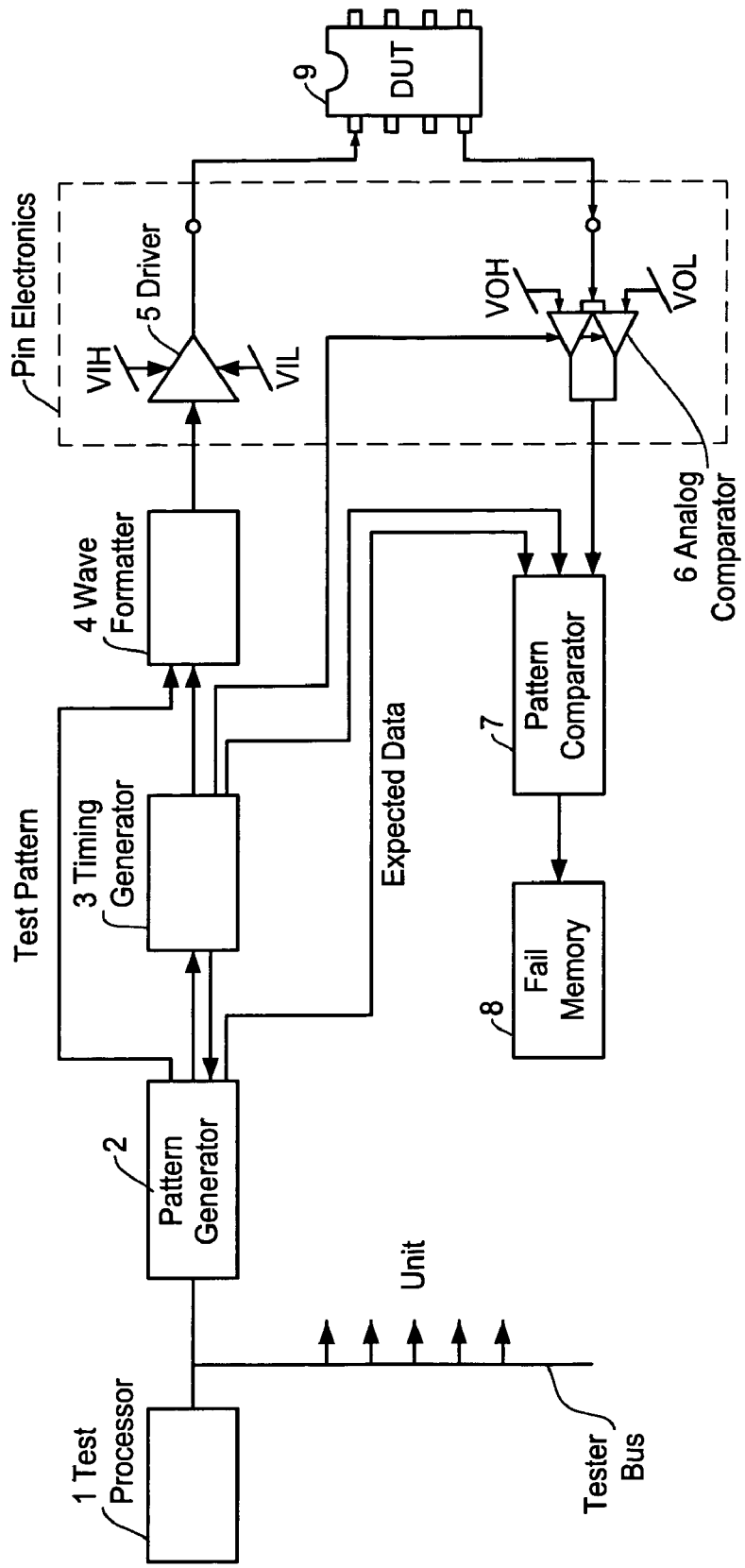
FIG. 1 is a schematic block diagram showing an example of structure in a conventional semiconductor test system which generates test signals and test strobe based on test data described in a cycle base format.
Figure 2:
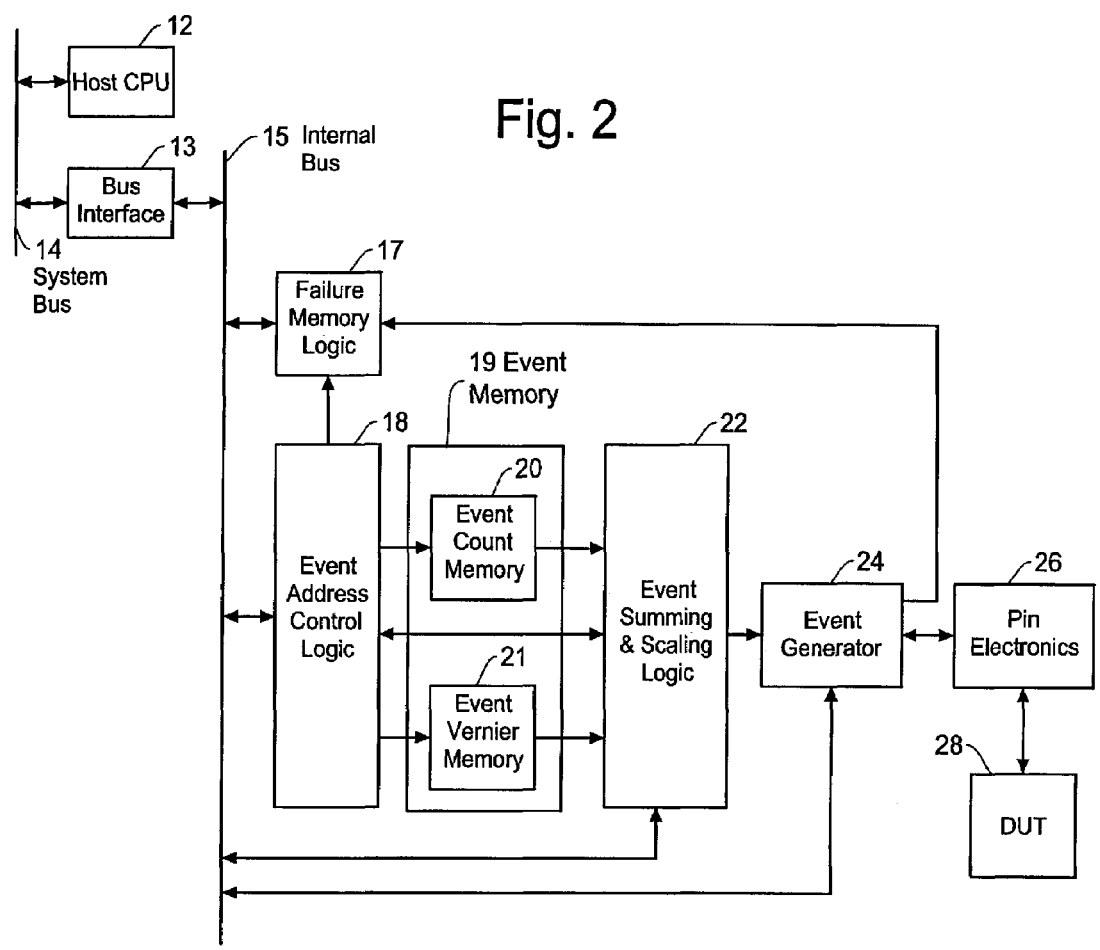
FIG. 2 is a schematic block diagram showing an example of structure in an event based test system which implements the test method of the present invention.

FIG. 2 is a schematic block diagram showing an example of basic structure in an event based test system for implementing the test method of the present invention. The event based test system includes a host computer 12 and a bus interface 13 both are connected to a system bus 14, an internal bus 15, an address control logic 18, a failure memory 17, an event memory 19 consisting of an event count memory 20 and an event vernier memory 21, an event summing and scaling logic 22, an event generator 24, and a pin electronics 26. The event based test system is to evaluate an IC device under test (DUT) 28 connected to the pin electronics 26.

An example of the host computer 12 is a work station having a UNIX, Window or Linux operating system. The host computer 12 functions as a user interface to enable a user to instruct the start and stop operation of the test, to load a test program and other test conditions, or to perform test result analysis. The host computer 12 interfaces with a test system hardware through the system bus 14 and the bus interface 13. Although not shown, the host computer 12 is preferably connected to a communication network to send or receive test information from other test systems or computer networks.

The internal bus 15 is a bus in the test system hardware and is commonly connected to most of the functional blocks. The address control logic 18 provides instructions to other functional blocks in the test system based on the test program and conditions from the host computer 12. The failure memory 17 stores test results, such as failure information of the DUT 28, in the addresses defined by the address control logic 18. The information stored in the failure memory 17 is used in the failure analysis stage of the device under test.

The address control logic 18 provides address data to an event memory 19 which typically consists of an event count memory 20 and an event vernier memory 21 as shown in FIG. 2. In an actual test system, a plurality of sets of event memory will be provided, each of which may correspond to a test pin of the test system. In the event memory 19, the event count and vernier memories 20, 21 store the timing data for each event and the event type data. The event count memory 20 stores the timing data which is an integer multiple of the reference clock (integral part), and the event vernier memory 21 stores timing data which is a fraction of the reference clock (fractional part). For example, the timing data for each event is expressed by a time difference (delta time) between two adjacent events.

The event summing and scaling logic 22 is to produce data showing overall timing of each event based on the delta timing data from the event count memory 20 and event vernier memory 21. Basically, such overall timing data is produced by summing the integer multiple data and the fractional data. During the process of summing the timing data, a carry over operation of the fractional data (offset to the integer data) is also conducted in the event summing and scaling logic 22. The timing shift function and clock scaling function involved in the present invention are performed by the event summing and scaling logic 22.

The event generator 24 is to actually generate the events based on the overall timing data from the event summing and scaling logic 22. The events (ex. test signals and expected values) thus generated are provided to the DUT 28 through the pin electronics 26. Basically, the pin electronics 26 is formed of a large number of components, each of which includes a driver and a comparator as well as switches to establish input and output relationships with respect to the DUT 28.

Figure 3:
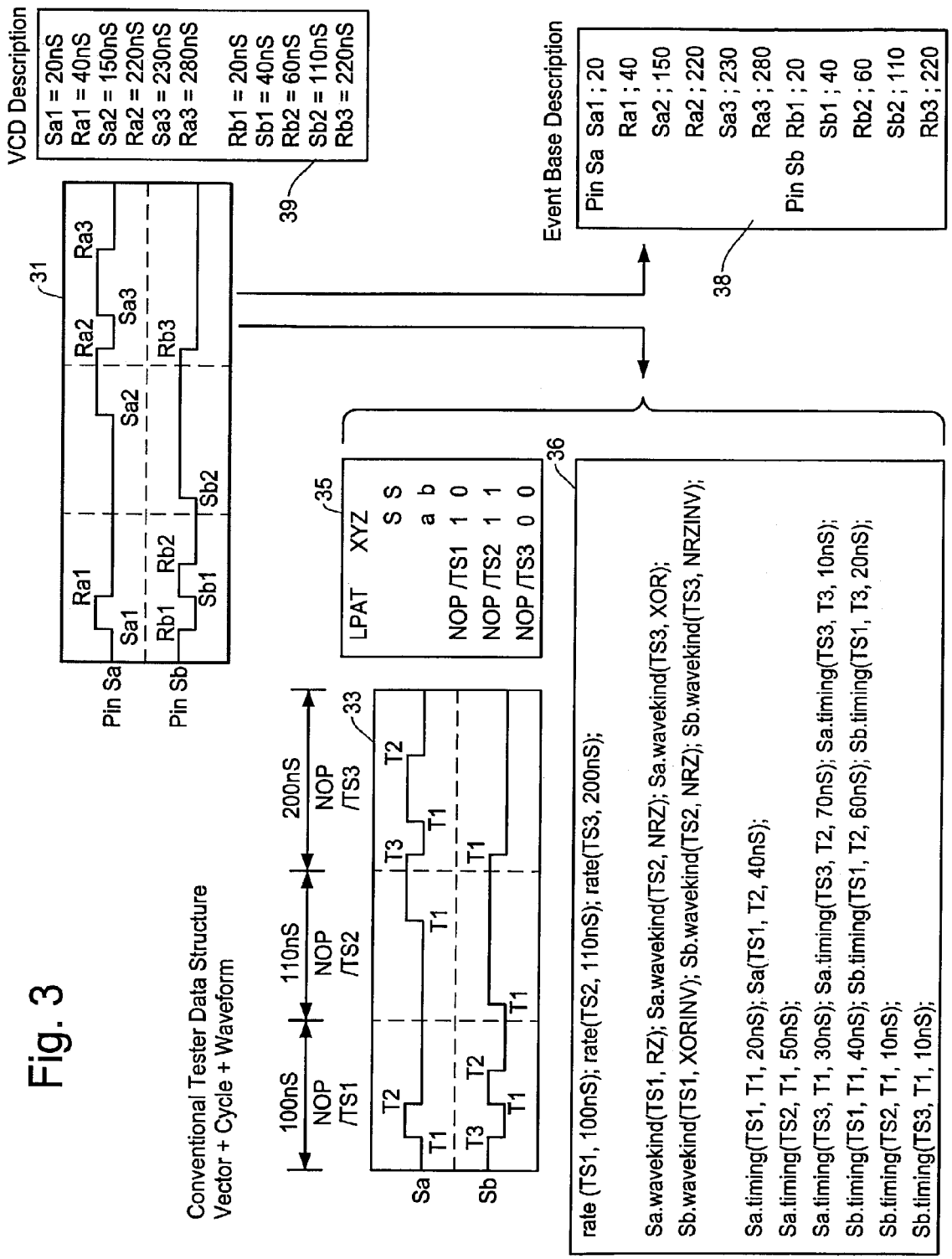
FIG. 3 is a diagram for comparing an example of data structure in the conventional cycle based test system and the descriptions in the event based test system for generating the same test signals.

FIG. 3 illustrates brief comparison between the data structure in the conventional cycle based test system and the data structure in the event based test system for generating the same test signals (patterns). This example compares the case where the test pattern waveforms 31 have to be generated by the test data in the cycle based format and the test data in the event based format. The waveforms 31 are signals applied to two pins Sa and Sb of the IC device which is typically produced in the logic simulation process in the design of the IC device where VCD (Value Change Dump of Verilog) description 39 is also shown.

To produce the waveforms 31, the event data used in the event based test system describes the waveforms with combinations of set and reset edges San, Sbn, Ran and Rbn, and their timings as shown in the event base description 38. In this description, the timing for each event can be expressed by a relative time length from previous event or an absolute time length from a specified reference point. As can be seen from FIG. 3, the event base description 38 is basically the same as the VCD description 39.

For producing the waveform 31 in the conventional test system based on the cycle based concept, the test data must be divided into test cycles (time-sets), waveforms (types of waveforms and their edge timings), and vectors (pattern values). More specifically, regarding the cycle based data structure, the vector (pattern) data 35 and test cycle (time-sets) data 33 are shown in the left part of FIG. 3. As can be seen from FIG. 3, a test pattern is divided into each test cycle, i.e, a combination of one or more time-sets (TS1, TS2 and TS3) to define the waveforms and timings for each test cycle.

An example of data descriptions for such waveforms, timings and test cycles is shown in waveform data 36. An example of logic "1", "0" or "Z" of the waveforms is shown in the pattern data 35. For example, in the waveform data 36, the test cycle is described by "rate" to define time intervals between test cycles, and the waveform is described by RZ (return to zero), NRZ (non-return to zero) and XOR (exclusive OR). Further, the timing of each waveform is defined by a delay time from a predetermined edge (ex. start edge) of the corresponding test cycle.

As noted above, the event base description 38 is identical to the design simulation results (VCD) 39 while the cycle base description requires the time-sets and various types of descriptions which are too remote from the original design simulation result. Because of this complexity of data structure in the conventional test system, it is not possible to easily or freely change the timing of the particular point of the test pattern or the repetition rate of the clock. Further, due to the limited number of time-sets, it is difficult to freely change the timing of the test pattern in the cycle based semiconductor test system.

Figure 4A:
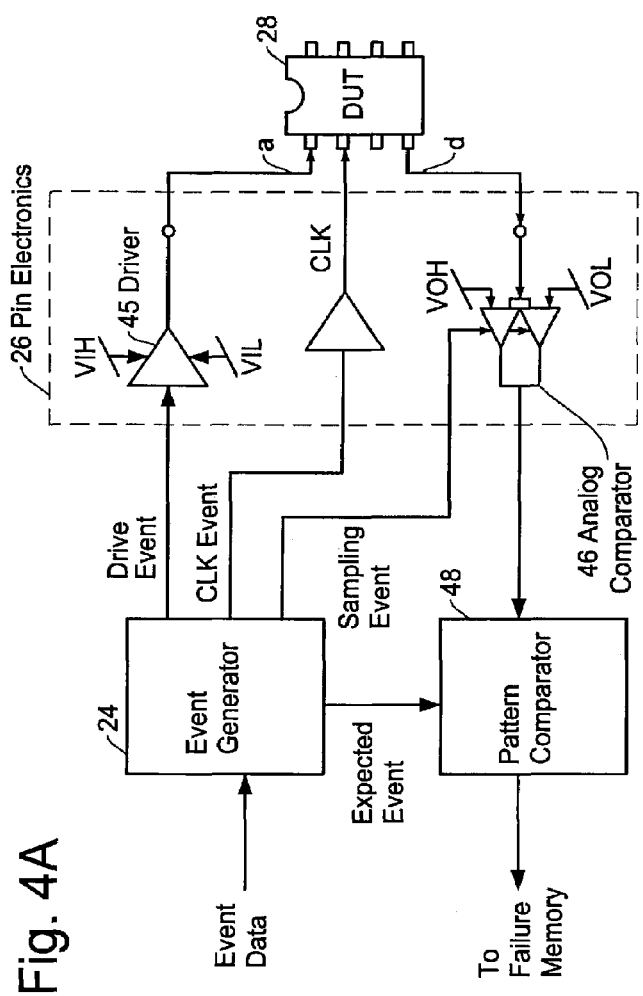
FIG. 4A is a block diagram showing the pin electronics of FIG. 2 and associated drive events and sampling event in the event based test system of the present invention.
Figure 4B:
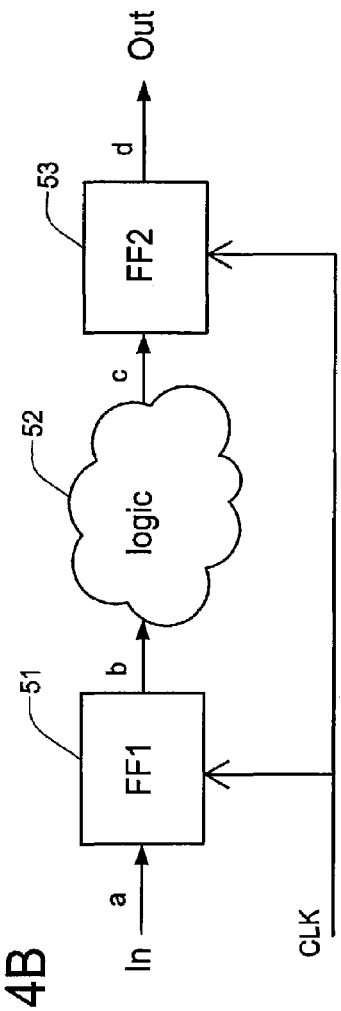
FIG. 4B is a schematic diagram showing a basic configuration for testing a timing failure of an IC device.

FIGS. 4A–4B show an example of circuit structure for testing an IC device (DUT) 28 by the event based test system of FIG. 2. As shown in FIG. 4A, the pin electronics 26 of FIG. 2 includes a driver 45 for supplying a test signal (drive event) to an input pin of DUT 28 and a comparator 46 for sampling a response signal from an output pin of DUT 28 at a timing of a sampling (strobe) pulse (sampling event). In an actual test system, a large number of drivers and comparators are provided to accommodate a large number of device pins of an IC device. The drive event and sampling event are produced by the event generator 24 based on the event data from the event summing and scaling logic 22 of FIG. 2. The sampled output of the comparator 46 is evaluated by a pattern comparator 48 based on the expected value (expected event) from the event generator.

FIG. 4B shows a simplified structure with respect to DUT 28. For simplicity, a particular circuit between an input pin In and an output pin Out of DUT 28 is represented by two flip-flops 51 (FF1) and 53 (FF2) and some random logic 52 between the flip-flops 51 and 53. In FIG. 4B, "CLK", "a", "b", "c" and "d" respectively represent clock signals for the flip-flops 51 and 53, an input of the flip-flop 51, an input of the random logic 52, an input of the flip-flop 53, and an output of the flip-flop 53. The clock "CLK", input "a" and output "d" in FIG. 4B respectively correspond to the clock "CLK", input "a" and output "d" in FIG. 4A.

Figure 5A:
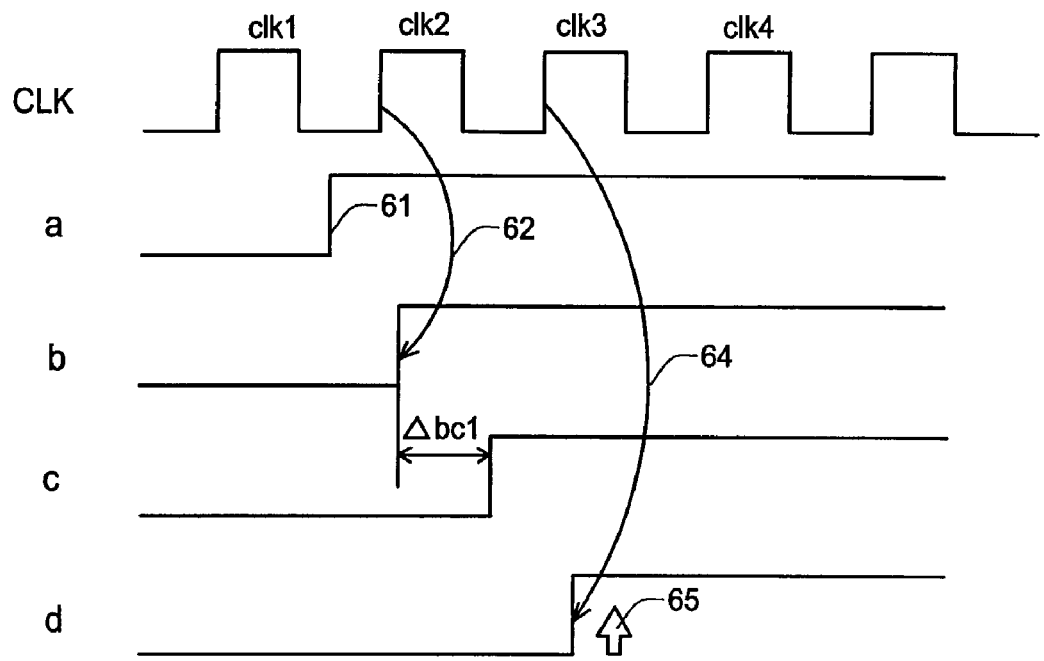
Figure 5B:
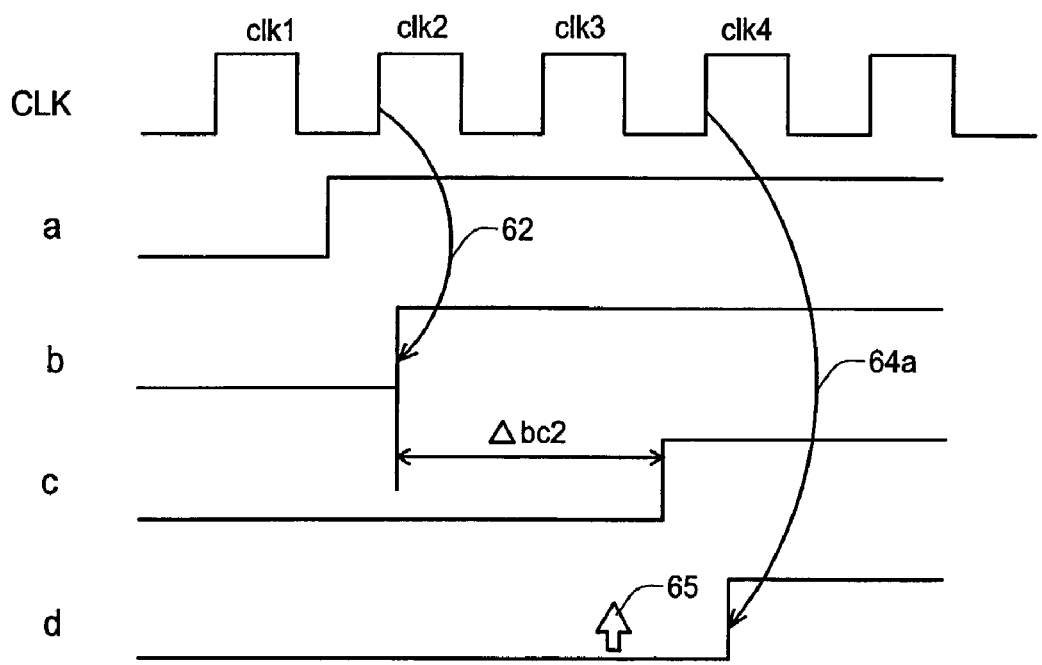

FIGS. 5A–5C are timing charts showing waveforms involved in testing the DUT 28 of FIG. 4B. First, the input signal "a" to the flip-flop 51 is driven to "1" at a timing 61. Then, the output of the flip-flop 51 is latched "1" at a timing 62 with the rising edge of the clock (clk2). In this case, a propagation delay Δbc1 through the random logic 52 shows a normal value. After 0-to-1 transition in the random logic 52 at its output "c", the output "d" of the flip-flop 53 is latched "1" with the rising edge of the clock (clk3). The output "d" is sampled by the timing of a strobe 65, which shows a correct value (pass).

In FIG. 5B, suppose that due to a certain reason, the propagation delay Δbc2 through the random logic 52 is significantly larger than the normal propagation delay Δbc1 of FIG. 5A. Due to this large delay, the value at the input "c" of the flip-flop 53 remains "0" at the edge of clock (clk3). Hence, the output "d" of the flip-flop 53 is also in the "0" state at the timing of the strobe 65, which shows an incorrect value (fail). In this case, the output of the flip-flop 53 changes to the high level by the rising edge of the clock (clk4) after the strobe 65.

The cause of this failure is the excessive delay through the random logic 52 for the signal to propagate from the input "b" to the output "c". This is a timing related failure. The signal at "b" changes at the rising edge of clock 2 while the signal at "c" requires two clock periods. Hence, this excessive propagation delay has to be identified by delaying the latch operation at the flip-flop 53 as shown in FIG. 5C. In FIG. 5C, if an extra time 66a and 66b is added between the clock clk2 and clock clk3 (also to the strobe 65), the value at the input "c" of the flip-flop 53 changes to "1" before the rising edge of the clock clk3. As a result, the value at the output "d" of the flip-flop 53 changes to "1" with the rising edge of the clock clk3, which shows the correct value (pass).

In the case where the failure is detected as in the example of FIG. 5B, it is necessary to determine whether the failure is a timing related failure or other failures such as stuck at fault (bridge, short, open, etc.). Generally, such a timing related failure can be distinguished from other failures by changing the timing of the particular point of the test signal (test pattern), for example, the edges of the clock CLK in FIG. 5C, until the output level changes. The event based test system is able to freely change (stretching or shrinking) the timings of the test signal by offsetting (shifting) the particular point of the test signal or changing the clock rate by a desired scale factor, which is not possible by the conventional test system.

Figure 6:
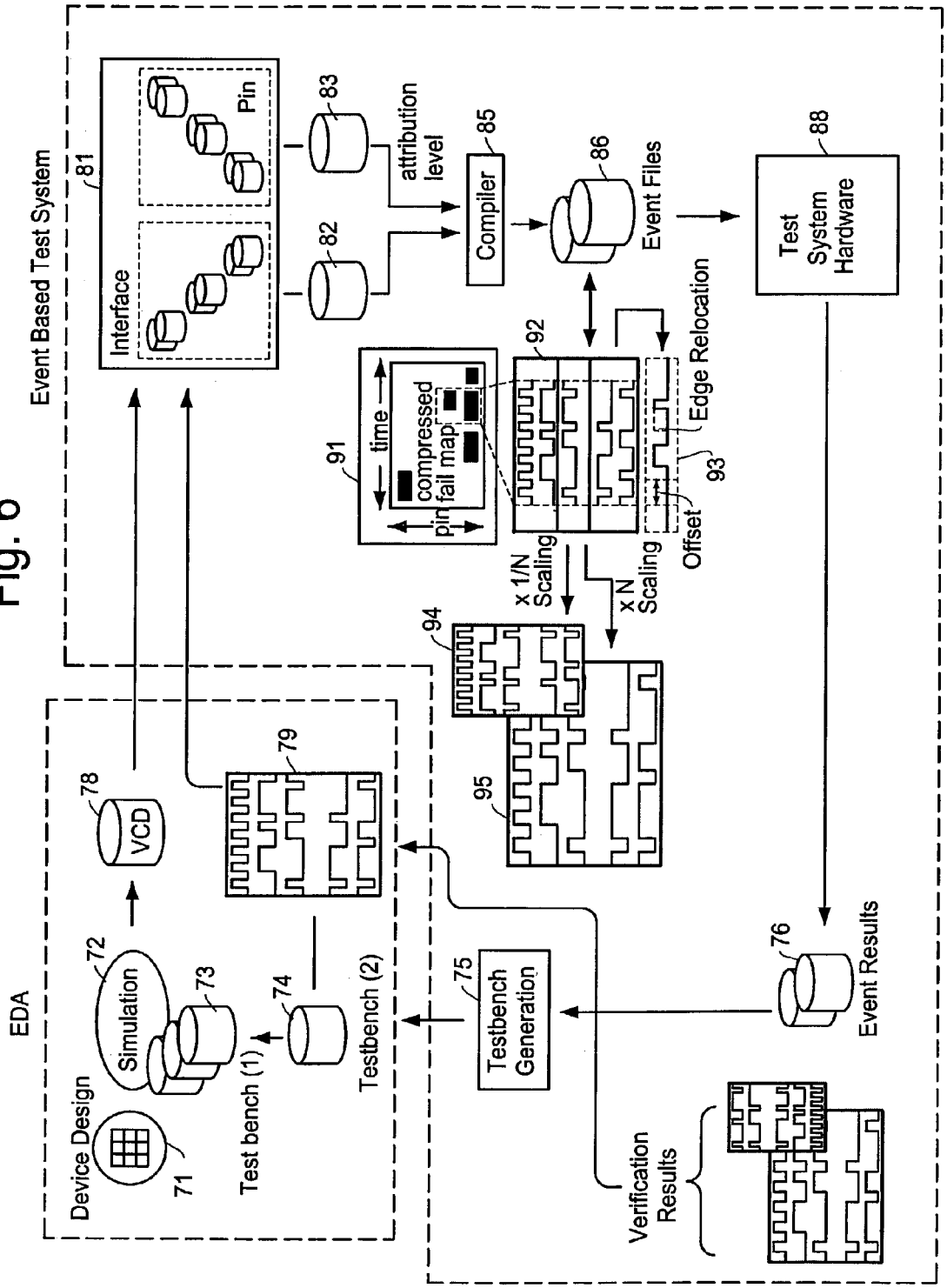
FIG. 6 is a block diagram showing functions of the event based test system of the present invention and an overall relationship between the event based test system with an electronic design automation (EDA) environment for designing and debugging the IC design.

FIG. 6 shows unique functions of the event based test system which implements the test method of the present invention. As shown in FIG. 6, the event based test system is capable of freely changing the timing of the test pattern by a scaling function and an offset (shift) function. FIG. 6 also shows an overall relationship between the event based test system and an EDA (electronic design automation) environment although the EDA environment itself is not directly related to the subject matter of the present invention. Because the data structure in the event based test system is in the event format, the EDA environment and the test system can be interrelated in a seamless fashion.

By executing a logic simulation process 72 on the LSI design data 71 with use of testbenchs 73 and 74, a dump file (VCD) 78 is produced. Through an interface 81, files 82 and 83 are created by assigning the event data from the dump file 78 or event data 79 from the testbench 74 to each test pin and defining signal level of each event. The data from the files 82 and 83 is converted to object codes by a compiler 85, thereby forming an event file 86.

When conducting a test on the device, the event data is transferred from the event file 86 to test system hardware 88. Based on the event data stored in the event memory, the test system hardware 88 generates an event based test pattern, thereby executing the test on the IC device under test. The test result is accumulated in a test result file 76 to be used in, for example, failure analysis. The test result accumulated in this manner can be feedbacked to the testbench through a testbench generator 75.

As in the foregoing, the event data formed in the event file directly describes the test pattern to be applied to the device under test. Therefore, with use of the event data, through graphic user interface (GUI), the pattern sequence identical to the actual test pattern can be displayed and modified. For example, the GUI of FIG. 6 includes an overall image 91 showing the test pattern and the test pins, an enlarged view 92 of a selected portion of the test pattern, timing charts 94 and 95 showing the timings which are compressed (chart 94) or enlarged (chart 95) by a predetermined scale factor, and an offset image 93 in which the timing (or position) of the specific edge are freely changed. Such changes in the parameters on the display can be done by modifying the event data in the event file 86, which also changes the actual test pattern applied to the device under test and thus enables to monitor the resultant response of the device under test.

Details of the scaling function is described in the U.S. application Ser. No. 09/286,226 owned by the same assignee of the present invention. Further, an example of time shift or offset (stretch or shrink) is described in U.S. patent application Ser. No. 10/039,720 owned by the same assignee of the present invention. Both U.S. application Ser. Nos. 09/286,226 and 10/039,720 are incorporated by reference.

In such an environment that defines signals by events and event timings as described with reference to FIGS. 3 and 6 (also will be described with reference to FIGS. 10A–10B), event timing can be edited or changed to shift or move an event in time. Such shifting of events in time effectively provides stretching/shrinking of the appropriate portion of the test signal as shown in FIG. 5C. Further, in the event based test system, all events and their timing are available to user, they can be edited or changed as desired. Therefore, any number of portions within a test pattern as well as any number of edges in the test pattern can be stretched/shrunk by changing the event data (timing and event type) of the respective events.

Using this concept of changing the timing of event, it is possible to develop a systematic procedure that locates the necessary events and then shifts those events in time. Thus, it is possible to stretch or shrink (shift or offset) the required portion of the test pattern to determine if a particular failure is indeed a timing related failure. An example of such a systematic procedure of the present invention is given as follows with reference to the flow chart of FIG. 7.

Figure 7:
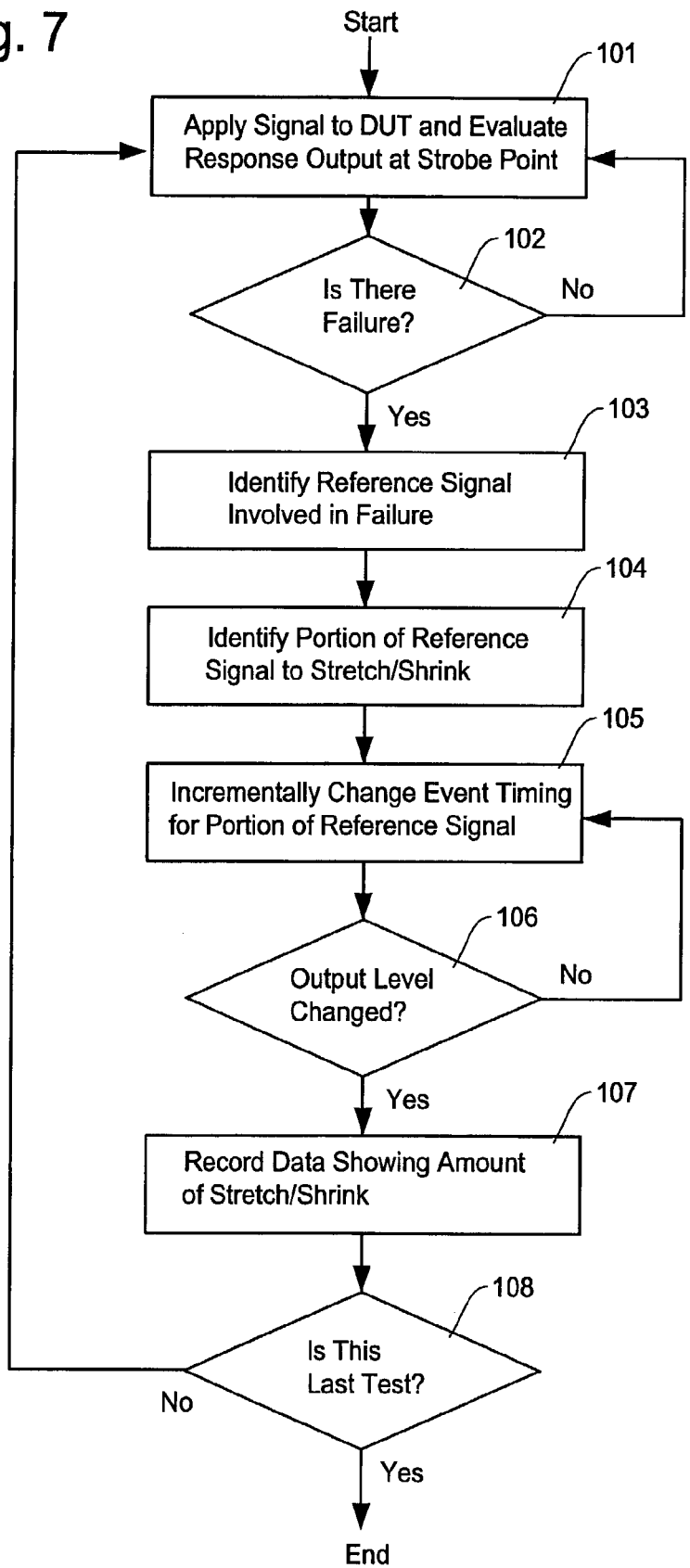
FIG. 7 is a flow chart showing an example of basic procedure in the test method of the present invention for debugging the timing related faults in the IC device.

In the flow chart of FIG. 7, at step 101, the test starts by applying a test signal to the IC device under test (DUT) and evaluating a response output of the DUT. At step 102, the process determines if there is any failure in the response output from the DUT. If there is no failure, the test continues such as for other test items. When a failure is detected, it is necessary to determine whether the detected failure is a timing related failure rather than other failures (functional failure, stuck at fault, etc.).

Thus, in step 103, the process identifies which reference signal is related to the detected failure. Typically, such a reference signal is a clock in the manner shown in FIGS. 5A–5C. At step 104, the process further identifies a portion (edge) of the reference signal to be shifted (ex. either stretched or shrunk). Typically, such an identified portion is an edge of the reference signal one or more cycles preceded to the strobe as shown in FIG. 5C.

At step 105, the timing of the identified portion of the reference signal is incrementally changed, thereby shifting (stretching or shrinking) the selected edge of the reference signal. This process is achieved by changing the event data (event timing and event type) in the event memory in the event based test system. The timing resolution for this timing shift and the total amount of timing shift can be freely selected by simply changing the event data. While shifting the edge timing, the process determines whether there is any change (ex. pass result) in the response output at step 106. If there is no change in the DUT output, the process of timing shift continues.

When the process detects a change in the output of the DUT, it is known that this particular failure is a timing related failure. This is because in other types of failures such as stuck at fault, there is no change in the output no matter how the timing of the reference signal is changed. Thus, if the output status is changed, at step 107, the information involved in this change, such as an amount of time shift, is recorded as a test result. At step 108, the process checks whether all of the test items have been completed, and if so, the process ends. If there are other tests remain, the steps 101–108 will be repeated until finishing all of the tests.

In the concept and procedure above, the test method of the present invention defines test signals by events and event timings, and changes the event timing that in-effect stretches or shrinks the associated portion of the test signal. This concept can be extended to stretching or shrinking of the whole test pattern (by changing timing of all events in the test pattern) as well as stretching or shrinking of all test signals in a selected part of test pattern (by changing timing of all events in all signals in the selected part). Through such global changes in the event timings, various conventional operations can also be performed such as speed binning and frequency sorting of IC devices.

This concept is illustrated by simple diagrams as shown in FIGS. 8A–8C and 9. In FIG. 8A, a 100 MHz clock signal is shown which represents a nominal test. Frequency sort and speed binning operations require that the test is applied at multiple frequencies, some of them may be higher and lower than the nominal test frequency. For example, one can develop test programs at 125 MHz, 100 MHz and 80 MHz, respectively, apply these test programs to IC devices under test and sort the IC devices based upon pass/fail results, which is done by the conventional test system.

The same results can be achieved in the present invention without replacing the test programs at different frequencies, but using one test program while incorporating the above concept of changing the timings of events. This can be visualized as change of event timing for all events simultaneously (global change). For example, the 100 MHz clock signal shown in FIG. 8A has alternative 1-to-0 and 0-to-1 events; hence, a time between any two events (delta time) is 5 ns. Let us consider the case where the delta time is changed from 5 ns to 6.25 ns for all events in the test signal of FIG. 8A. The resultant signal is shown in FIG. 8B that is effectively an 80 MHz signal. Similarly, by changing the delta time to 4 ns for all events, effectively, a 125 MHz clock signal as shown in FIG. 8C is achieved. Typically, the above clock change is achieved by the scaling function of the event based test system as described with reference to FIG. 6 by multiplying the event timing data by a scale factor.

The clock scaling shown in FIGS. 8A–8C can be applied to selected portions of the test pattern as shown in FIG. 9. In the first portion (partition 1) of the test pattern, the clock is modified by a scale factor so that the repetition rate thereof is 80 MHz (time period 12.5 ns). In the second portion (partition 2) of the test pattern, the clock rate is modified to 100 MHz (time period 10 ns), and in the third portion (partition 3) of the test pattern, the clock rate is changed to 125 MHz (time period 8 ns). In this manner, the timings of the test signal can be changed proportionally without changing the test program. This in essence means that the test is run at 3 different frequencies for different portions using one test program, which improves the test efficiency and test cost.

The above procedure provides a systematic method to determine if a failure is indeed timing related. By implementing this procedure in a software program that runs on an event based system, one can also determine the timing range of the failure. For an event test system such as described in the U.S. Pat. Nos. 6,360,343 and 6,532,561 owned by the same assignee, the inventors have automated this procedure with a software program.

Before describing the automated procedure of the test method of the present invention, an example of relationship between the event data in the event memory and the resultant events is briefly described with reference to FIGS. 10A–10B. FIG. 10A shows an example of event data stored in an event memory in the event based test system for producing the event waveforms of FIG. 10B. The event data is composed of event timing data and event type data. The event timings are defined by time lengths $\Delta V_n$ ($\Delta V_0$, $\Delta V_1$, $\Delta V_2$, ...) between two events. Each event timing is expressed by the combination of event count Cn (C1, C2, C3, ...) which is an integer multiple of the reference clock and event vernier Vn (V1, V2, V3, ...) which is a fraction of the reference clock. As seen from FIGS. 10A and 10B, a particular event, for example, Event 2 has a timing which is determined by a sum of the previous event timings ($\Delta V_0$, $\Delta V_1$ and $\Delta V_2$) and is a falling edge which is defined by the event type data "Drive Logical Low".

Based on the understanding of the relationship between the event data (event timing and event type) and the resultant event shown in FIGS. 10A–10B and the basic test procedure shown in FIG. 7, the step-by-step procedure to determine the timing range of a failure is given below for the same example of FIGS. 4B and 5A–5C. While the procedure given below uses the stretch operation in this automation, one can automate the shrink operation in the procedure equivalent to the below.

Figure 11:
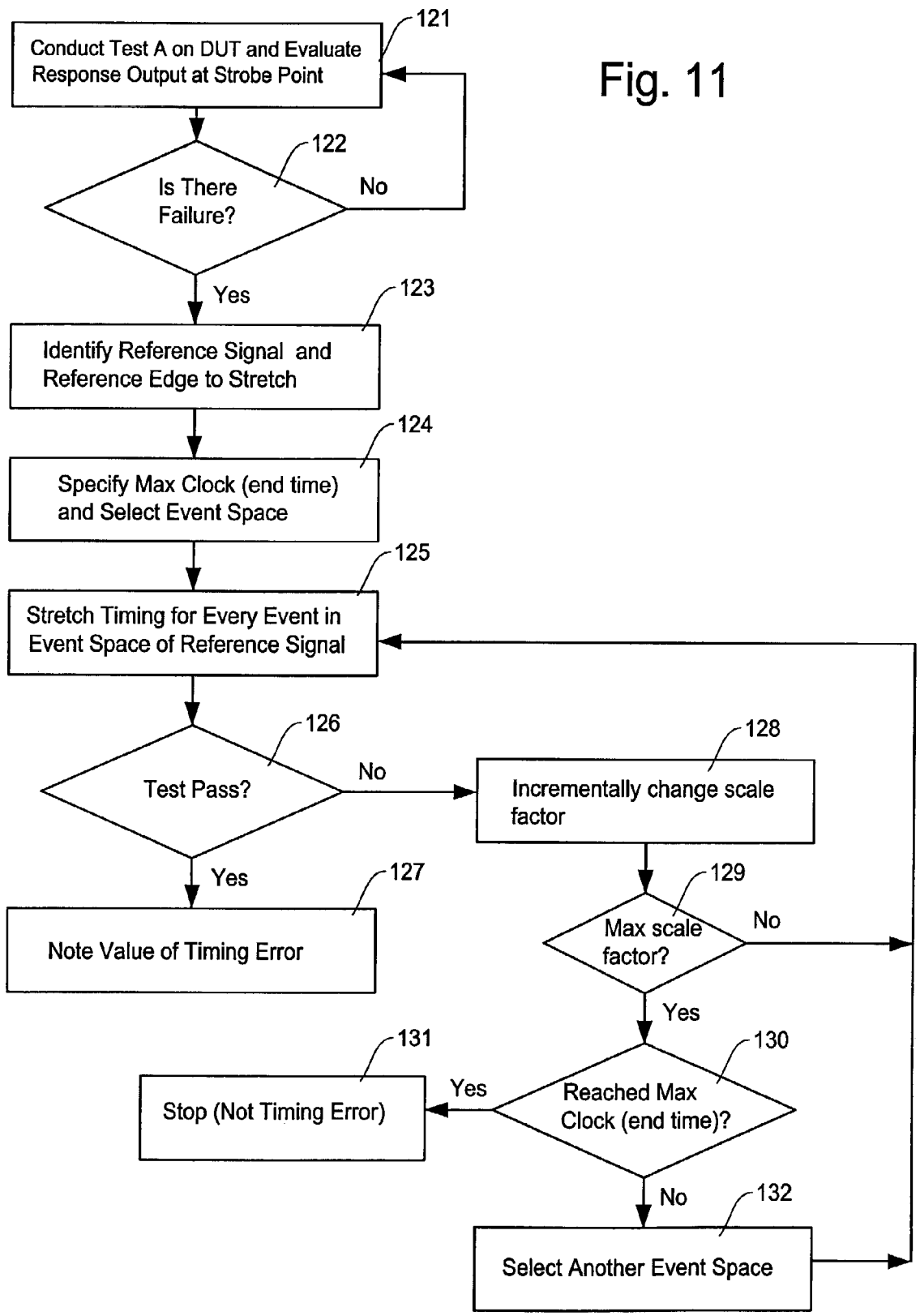
FIG. 11 is a flow chart showing another example of procedure in the test method of the present invention for debugging the timing related faults in the IC device.
Figure 12:
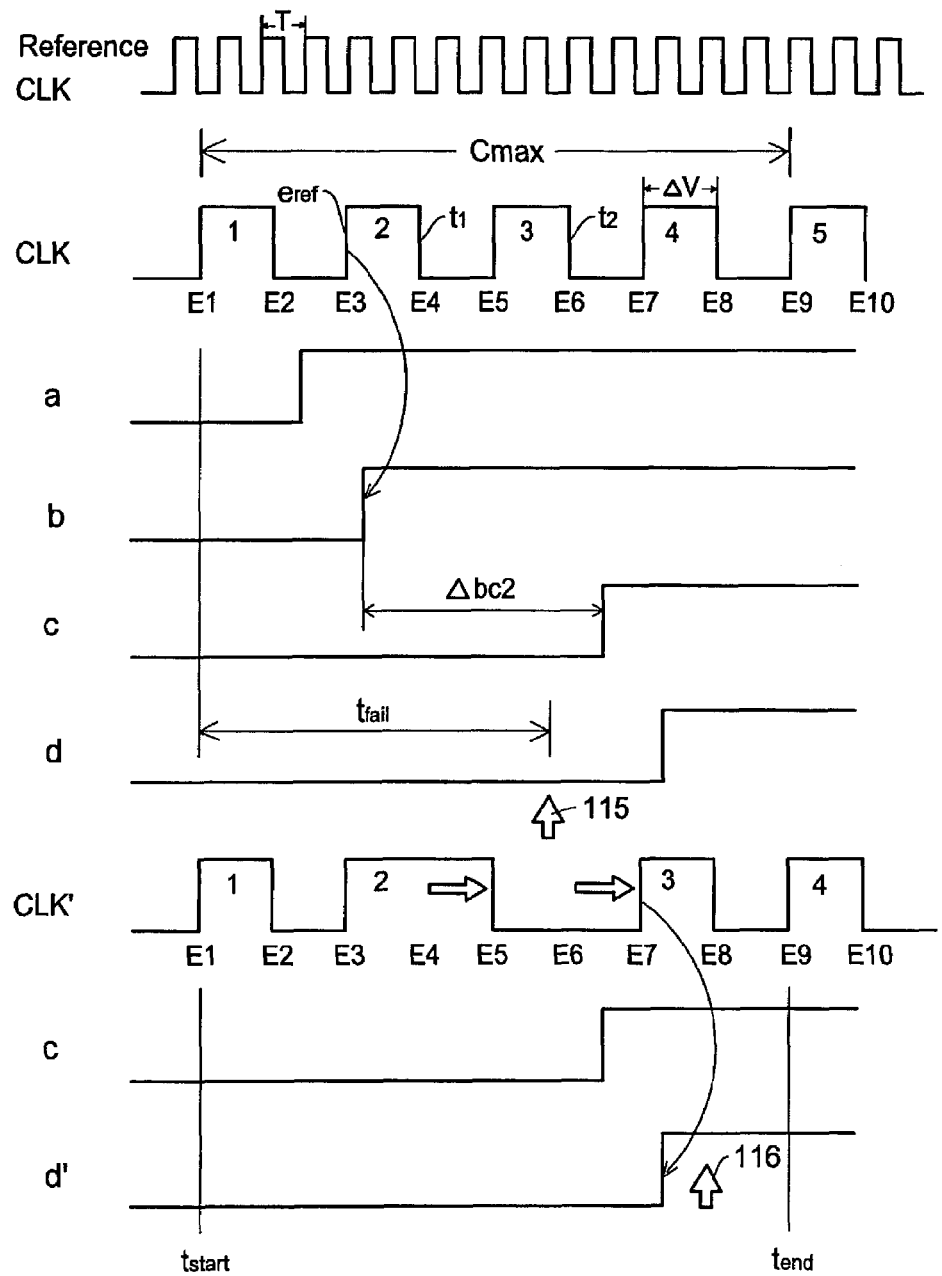
FIG. 12 is a timing chart showing an example of waveforms in the procedure of FIG. 11 which corresponds to the situation of FIGS. 4B and 5A–5C.

In this example, FIG. 11 is a flow chart showing the operational flow of the program, and FIG. 12 is a timing chart showing the waveforms in the stretch operating. FIG. 13A shows the event data for the clock CLK (reference signal) of FIG. 12, and FIG. 13B shows the event data for the clock CLK' (reference signal) for stretching the timings of the particular edges. For simplicity, the following example describes a situation of the first failure (fail event) in a test A, and assumes that the time of the fail event is $t_{fail}$ (in this example, a time length from the start to the strobe):

The program starts the test A at step 121 (at $t_{start}$ of FIG. 12) in which the process evaluates the output of the DUT by applying test signals to the (DUT) and evaluating a response output of the DUT. In this example of FIGS. 11, 4B and 5A–5C, the test signals include an input signal "a" and a clock CLK. At step 122, the process determines if there is any failure in the response output from the DUT. If there is no failure, the test A continues such as for other pins or parameters. When a failure is detected, the process moves to steps to determine whether the detected failure is a timing related failure.

Therefore, in step 123, the process identifies a reference signal and a reference edge (particular edge of the reference signal) for adjusting the timings thereof for distinguishing the type of the failure. As noted above, in this example, the reference signal is the clock CLK applied to the DUT and a reference edge is an $e_{ref}$ of the clock CLK shown in FIG. 12. Typically, a reference edge $e_{ref}$ is selected from the edges within the fail time $t_{fail}$, and in this example, is the second rising edge (event E3) of the clock CLK because the input signal "a" is latched at the output "b" of the flip-flop 51 (FIG. 4B) by the reference edge $e_{ref}$ while the failure is detected by the timing of the strobe 115. The reference edge $e_{ref}$ serves as the start time for stretching the portion of the reference signal At step 124, the maximum clock number Cmax (or an end time $t_{end}$) and an event space ($t_1$, $t_2$) are specified. As noted above, in the case where no change is observed at the output "d" of the DUT, even when a predetermined timing change is made, the detected failure is determined as not a timing related failure (short, open, bridge, etc.). Such an maximum clock Cmax (end time $t_{end}$) is determined in a case-by-case basis depending on the function, structure of the DUT and a type of test. In this example, the maximum number of clock Cmax is four as shown in FIG. 12. The event space ($t_1$, $t_2$) specifies a particular time range of events concerning the reference signal for stretching the timings. In this example, the timings of events E4, E5 and E6 will be stretched in a manner shown in FIGS. 13A–13B. In other words, when a time t of an event is smaller than $t_1$, i.e., $t<t_1$, the timing stretch for the event is not performed, however, when the time t is within the event space defined by $t_1$ and $t_2$ above, i.e., $t_1 \leq t \leq t_2$, the timing stretch for the event is performed.

In step 125, the process stretches the timing of the every event in the event space. Thus, the clock CLK (reference signal) is stretched in the particular edges as shown in the clock CLK' in FIG. 12. An example of event data for generating the clock CLK and the clock CLK' (timing stretched) of FIG. 12 is shown in FIGS. 13A and 13B, respectively. It should be noted that FIGS. 13A and 13B illustrate only one example where many other ways of describing the event data are possible for achieving the stretch or shrink operation.

As seen from the timing chart of FIG. 12, the clock CLK has a constant time period and the rising and falling edges are defined as events E1–E10. A time length between two adjacent events (delta time) is ΔV which is described by the event timing data as shown in FIG. 13A. As described in detail in the above noted patents of the assignee, each event timing is described by a combination of event count data (integer multiple of reference clock) and event vernier data (fraction of reference clock). Thus, when the time period of the reference clock is T (FIG. 12), the timing data ΔV of each event (time difference from previous event) is expressed as ΔV=TCr+Vr. Further in FIG. 13A, the event type data describes a type of event for each event. Since the clock CLK has the same time interval throughout with the rising and falling edges alternately, the event type data alternately shows "Drive Logical High" and "Drive Logical Low".

To stretch the timings of events E4, E5 and E6 as shown in the clock CLK' of FIG. 12, the event data is changed in FIG. 13B. In this example, to stretch the timing of event E4, the event type data is changed to show the same event type as the previous event E3. Thus, the event type data of the event E4 is now "Drive Logical High" rather than "Drive Logical Low". Similarly, the event type data of the event E5 is changed to show the different event different from the previous event E4. Thus, the event type data of the event E5 is now "Drive Logical Low" rather than "Drive Logical High". Therefore, the events E3 and E4 have the same event type, and the events E5 and E6 have the same event type, resulting in the timing stretch of the edges as shown by the arrows of FIG. 12. The process similar to the above will be repeated to further stretch the timings by consecutively repeating the same event type three or more times for the particular edge.

The time duration to which stretching is done, is computed as the time difference between the reference edge from the previous event data and the time of occurrence of the current reference edge. That is, there is no implicit assumption that the reference signal is required to be a periodic signal. For the very first event data, the time duration is the time difference between $e_{ref}$ and the edge of the same event type immediately preceding it.

Referring back to the flow chart of FIG. 11, while stretching the timings of the edges of the reference signal, the process determines whether the output of the DUT changes to a pass event in step 126. If the pass event is detected, it is considered that the originally detected failure is a timing related failure. Thus, the data such as a value of the timing error is recorded in step 127. If the pass event is not detected in the foregoing procedure, the test method of the present invention further utilizes the scaling function of the event based test system to increase or decrease the clock frequency in proportion to a specified scale factor.

Thus, in step 128, the process incrementally changes the scale factor of the reference signal (clock CLK). Basically, the scaling is done by multiplying the scale factor with the event timing data (Cr, Vr) in FIGS. 13A and 13B. At step 129, the process determines whether the scale factor has reached the maximum allowable scaling by the test system. If the scale factor is lower than the maximum allowable factor, the process goes back to the steps 125–127 to stretch the edge timing and evaluates the result. If the maximum frequency is reached, at step 130, the process determines whether the maximum number Cmax (or the end time $t_{end}$) is reached. If it is affirmative, the process ends at step 131 because the detected failure is not a timing related error. If it is negative, at step 132, the process selects another event space and repeats the steps 125–131.

As has been described, the primary advantage of this method is that it is event based and hence it overcomes the drawback of limited time-sets and wave-groups of the conventional semiconductor test system. The method is systematic and it can easily be automated. Because this method is based upon changing the event timing, any one or multiple events can be shifted in time. By changing one or a small number of events, a small portion of signal can be stretched or shrunk, while by changing all events in the signal, the whole signal can be stretched or shrunk. With this global stretch/shrink operation, it is also possible to perform traditional functions of semiconductor test system such as frequency sort and speed binning.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A test method for debugging timing related failures of an IC device with use of an event based test system, comprising the following steps of:
   applying a test signal to an IC device under test (DUT) and detecting a failure in a response output from the DUT;
   identifying a reference clock signal associated with the failure when the failure is detected in the response output;
   identifying a portion of the reference clock signal that is related to the detected failure in the response output from the DUT to stretch or shrink a timing of the identified portion;
   incrementally changing the timing of events for the identified portion of the reference clock signal without changing timings of the test signal until detecting a change of state from the failure to a pass result in the response output of the device under test; and
   repeating the above steps for remaining tests.

2. The test method as defined in claim 1, said step of incrementally changing the timing of events for the identified portion of the reference clock signal includes a step of changing event timing data of the events associated with the identified portion of the reference clock signal in the event based test system.

3. The test method as defined in claim 1, said step of incrementally changing the timing of the identified portion of the reference clock signal includes a step of changing event data of events associated with the identified portion of the reference clock signal by repeating the same event type two or more times.

4. The test method as defined in claim 1, said step of incrementally changing the timing of the identified portion of the reference clock signal includes a step of changing the timing by either stretching or shrinking a time length of a particular event of the reference clock signal from a previous event.

5. The test method as defined in claim 1, said step of incrementally changing the timing of events for the identified portion of the reference clock signal includes a step of changing the timing by either stretching or shrinking a time length of a particular event until the response output shows the pass result at a timing of a strobe and obtaining a timing range of the stretch or shrink until the pass result is detected.

6. The test method as defined in claim 1, further comprising a step of changing the timings of the events for the reference clock signal in proportion to a selected scaling factor.

7. The test method as defined in claim 6, wherein said step of changing the timings of the events for the reference clock signal includes a step of scaling the timings of events for the reference clock signal for two or more selected portions of a test pattern, wherein the timings of events for the reference clock signal at each selected portion of the test pattern is changed in proportion to the selected scaling factor.

8. The test method as defined in claim 1, further comprising a step of specifying a maximum number of reference clocks or an end time to define a time limit for an operation of distinguishing a timing related failure from other types of failure with respect to the detected failure.

9. The test method as defined in claim 8, said step of specifying the maximum number of reference clocks or the end time further comprising a step of determining that the detected failure is not timing related failure when the maximum number of reference clocks or the end time is reached before detecting the pass result in the response output.

10. The test method as defined in claim 1, further comprising a step of specifying an event space based on a timing of the detected failure, wherein the event space is a time range that includes one or more events constituting the reference clock signal, and wherein the timings of the events within the event space are changed, thereby stretching or shrinking the timing of the identified portion of the reference clock signal.

11. A test apparatus for debugging timing related failures of an IC device with use of an event based test system, comprising:
means for applying a test signal to an IC device under test (DUT) and detecting a failure in a response output from the DUT;
means for identifying a reference clock signal associated with the failure when the failure is detected in the response output;
means for identifying a portion of the reference clock signal that is related to the detected failure in the response output from the DUT to stretch or shrink a timing of the identified portion;
means for incrementally changing the timing of events for the identified portion of the reference clock signal without changing timings of the test signals until detecting a change of state from the failure to a pass result in the response output of the device under test; and
means for repeating the above operations for remaining tests.

12. The test apparatus as defined in claim 11, said means for incrementally changing the timing of events the identified portion of the reference clock signal includes means for changing event timing data of events associated with the identified portion of the reference clock signal in the event based test system.

13. The test apparatus as defined in claim 11, said means for incrementally changing the timing of events the identified portion of the reference clock signal includes means for changing event data of events associated with the identified portion of the reference clock signal by repeating the same event type two or more times.

14. The test apparatus as defined in claim 11, said means for incrementally changing the timing of events for the identified portion of the reference clock signal includes means for changing the timing by either stretching or shrinking a time length of a particular event of the reference clock signal from a previous event.

15. The test apparatus as defined in claim 11, said means for incrementally changing the timing of events for the portion of the reference clock signal includes means for changing the timing by either stretching or shrinking a time length of a particular event until the response output shows the pass result at a timing of a strobe and obtaining a timing range of the stretch or shrink until the pass result is detected.

16. The test apparatus as defined in claim 11, further comprising means for changing the timing of events for the reference clock signal in proportion to a selected scaling factor.

17. The test apparatus as defined in claim 16, wherein said means for changing the timing of events for the reference clock signal includes means for scaling the timing of events for the reference clock signal for two or more selected portions of a test pattern, wherein the timing of events for the reference clock signal at each selected portion of the test pattern is changed in proportion to the selected scaling factor.

18. The test apparatus as defined in claim 11, further comprising means for specifying a maximum number of reference clocks or an end time to define a time limit for an operation of distinguishing a timing related failure from other types of failure with respect to the detected failure.

19. The test apparatus as defined in claim 18, said means for specifying the maximum number of reference clocks or the end time further comprising means for determining that the detected failure is not timing related failure when the maximum number of reference clocks or the end time is reached before detecting the pass result in the response output.

20. The test apparatus as defined in claim 11, further comprising means for specifying an event space based on a timing of the detected failure, wherein the event space is a time range that includes one or more events constituting the reference clock signal, and wherein the timings of the events within the event space are changed, thereby stretching or shrinking the timing of the identified portion of the reference clock signal.

* * * * *